(12) United States Patent
May

(10) Patent No.: US 6,753,705 B1
(45) Date of Patent: Jun. 22, 2004

(54) EDGE SENSITIVE DETECTION CIRCUIT

(75) Inventor: Michael R. May, Austin, TX (US)

(73) Assignee: Sigmatel, Inc., Austin, TX (US)

( * ) Notice: Subject to any disclaimer, the term of this patent is extended or adjusted under 35 U.S.C. 154(b) by 0 days.

(21) Appl. No.: 09/626,574

(22) Filed: Jul. 27, 2000

(51) Int. Cl.[7] .............................................. H03K 5/22
(52) U.S. Cl. ............................ 327/24; 327/26; 327/87; 327/552
(58) Field of Search ............................ 327/24, 26, 27, 327/82, 85, 87, 552, 554, 557, 558, 559; 326/95, 96, 97; 323/312, 315, 316

(56) References Cited

U.S. PATENT DOCUMENTS

| 4,306,198 | A | * | 12/1981 | Okada ........................ 330/260 |
| 4,692,633 | A | | 9/1987 | Ngai et al. |
| 4,728,815 | A | * | 3/1988 | Main .......................... 327/165 |
| 4,940,904 | A | | 7/1990 | Lin |
| 4,989,003 | A | * | 1/1991 | Sauer ......................... 341/136 |
| 5,087,835 | A | * | 2/1992 | Hattangadi ................. 327/155 |
| 5,175,753 | A | * | 12/1992 | Gaglani ...................... 377/105 |
| 5,274,583 | A | * | 12/1993 | Rapp .......................... 364/829 |
| 5,436,853 | A | * | 7/1995 | Shimohara .................. 364/569 |
| 5,510,740 | A | * | 4/1996 | Farrell et al. ................ 327/141 |
| 5,894,229 | A | * | 4/1999 | Yamaoka et al. ............. 326/83 |
| 5,920,575 | A | | 7/1999 | Gregor et al. |
| 6,121,812 | A | * | 9/2000 | Tsukikawa .................. 327/280 |

* cited by examiner

Primary Examiner—Timothy P. Callahan
Assistant Examiner—An T. Luu
(74) Attorney, Agent, or Firm—Timothy W. Markison

(57) ABSTRACT

An edge sensitive detection circuit includes a filter module and a soft latch module. The filter module is operably coupled to receive an input logic signal that corresponds to the triggering of an event and produces a pulse signal in response to an edge of the input logic signal. The filter may include a capacitor operably coupled to a controlled impedance, an inverter and a driver transistor, wherein the capacitor senses an edge of the input logic signal and, in combination with the controlled impedance, produces the pulse signal. The soft latch module is operably coupled to receive the pulse signal and to latch a logic value in accordance with the pulse signal.

17 Claims, 2 Drawing Sheets

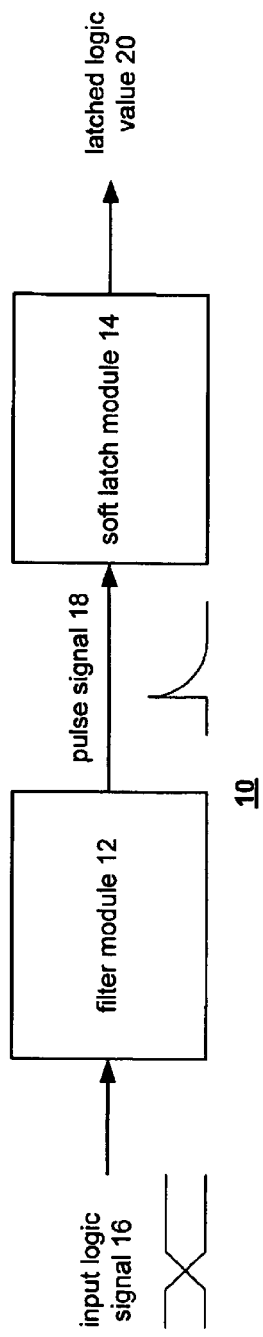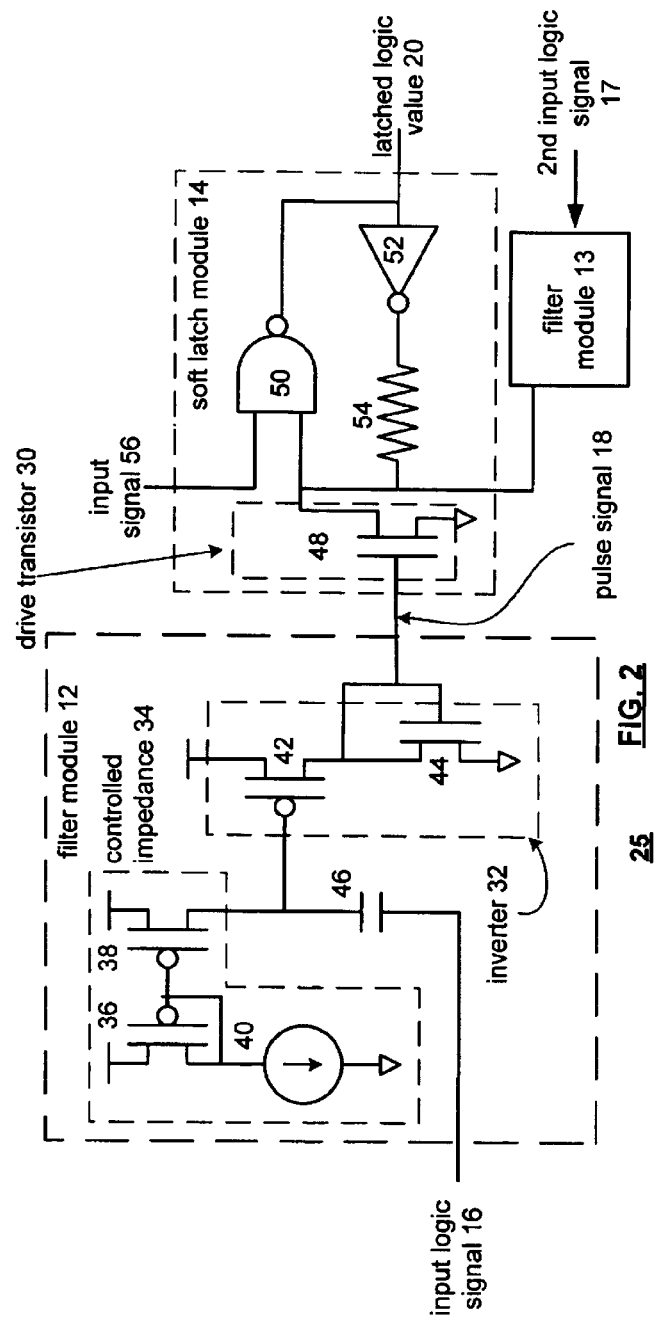

EDGE SENSITIVE DETECTION CIRCUIT

TECHNICAL FIELD OF THE INVENTION

This invention relates generally to detection circuits and more particularly to an edge sensitive detection circuit.

BACKGROUND OF THE INVENTION

Detection circuits are widely used in electronic equipment to detect an event that triggers initiation of a corresponding response. For example, detection circuits are widely used in computers, automobile engine control systems, microwave ovens, coffee makers, etc. In computers, an event may be power on, power down, standby, reset, an interrupt, change in settings, etc., where each of the events has a corresponding response. For example, the power on event has a corresponding response that turns the computer on in a predetermined manner.

As is known, a computer includes multiple layers of software and/or hardware that include detection circuitry/ software and/or response circuitry/software. To process a corresponding response from a detected event, different elements of the software and/or hardware process different aspects of the corresponding response and detecting the event. For example, for a power on sequence, a detection circuit must first detect the power on condition. For the "power on" detection circuit to detect a power on event, it must be receiving power. As such, the "power on" detection circuit is either operably coupled to a battery source or is included in the power supply. Before any of the associated software can be processed, the central processing unit (CPU) must be receiving power, the clocks must be up and running, and the interoperability between the CPU and memory must be up and running.

With power applied to the hardware components of the computer, the power on software may now be processed. Such power on software includes system BIOS, enabling the operating system, enabling video graphics processing, and enabling other peripheral components. Because of the distributed nature of the computer system, events are typically triggers as a logic setting. For example, a reset condition may occur when a reset pin is pulled to a logic "0" state and the reset condition is removed when the reset pin is pulled to a logic "1" state. Thus, an event is triggered when the detection circuit detects a predetermined logic state on a corresponding pin and no event occurs, or the event is removed, when the detection circuit detects an alternate predetermined logic state.

While logic state triggering of events works well in distributed systems, such as a computer, it does not work well in integrated systems. An integrated system has a difficult time processing events, such as power down, reset, standby, set, and power up when the event is triggered via a logic state change. The difficulty arises because the software that overwrites the logic state of the event needs to be active, such that the detection circuit may detect a change in the logic state of the event. However, the processor and memory interfaces cannot be activated to process the software to change the logic state of the event until the detection circuit detects a change in the logic state. Thus, a chicken and egg dilemma arises.

Therefore, a need exists for a detection circuit that overcomes the above described problems.

BRIEF DESCRIPTION OF THE DRAWINGS

FIG. 1 illustrates a schematic block diagram of an edge detection circuit in accordance with the present invention;

FIG. 2 illustrates a schematic block diagram of an alternate edge detection circuit in accordance with the present invention.

DETAILED DESCRIPTION OF A PREFERRED EMBODIMENT

Figure 3:
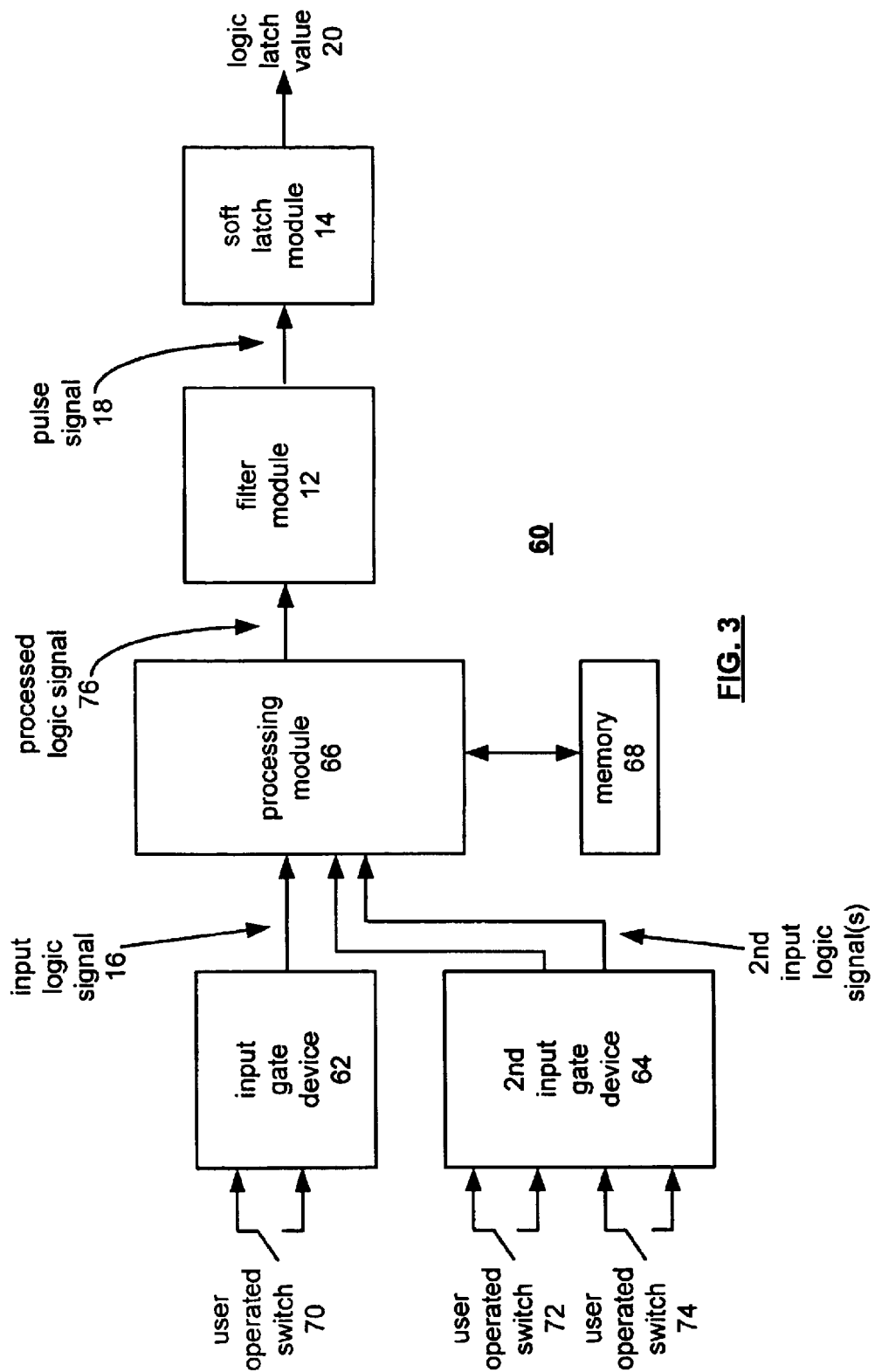
FIG. 3 illustrates a schematic block diagram of another edge detection circuit in accordance with the present invention.

Generally, the prevent invention provides an edge sensitive detection circuit that includes a filter module and a soft latch module. The filter module is operably coupled to receive an input logic signal that corresponds to the triggering of an event and produces a pulse signal in response to an edge of the input logic signal. The filter may include a capacitor operably coupled to a controlled impedance, an inverter and a driver transistor, wherein the capacitor senses an edge of the input logic signal and, in combination with the controlled impedance, produces the pulse signal. The soft latch module is operably coupled to receive the pulse signal and to latch a logic value in accordance with the pulse signal. With use of such an edge detection circuit in an integrated system, the integrated system overcomes the chicken and the egg dilemma of previous event detection circuits. For example, if an edge detection circuit were used as part of a power down control circuit, the software can power down the system by a state change and power up the system effectively at a later time.

The present invention may be more fully described with reference to FIGS. 1–3. FIG. 1 illustrates a schematic block diagram of an edge detection circuit 10 that includes a filter module 12 and a soft latch module 14. The filter module 12 is operably coupled to receive an input logic signal 16 that is representative of an event, where the signal 16 may be one of a reset signal, a power down signal, a power up signal, a standby signal, and a set signal. The filter module 12 is tuned to sense an edge of the input logic signal 16 such that it produces a pulse signal 18.

The soft latch module 14 receives the pulse signal 18 and produces a latched logic value 20. Depending on the state of the soft latch module 14 when the pulse signal is received, the state of the latched logic value 20 may toggle. For example, if the latched logic output value 20 were in a logic "0" state when the pulse signal 18 was received, the latched logic value 20 would toggle to a logic "1" state. If, however, the latched logic output value 20 were in a logic "1" state when the pulse signal 18 was received, the latched logic value 20 would not toggle. By sensing the edge of the input logic signal 16 and producing a pulse signal 18 therefrom, prevents the logic state of the input logic signal 16 from locking up the detection circuit (i.e., producing the chicken and egg dilemma).

FIG. 2 illustrates a schematic block diagram of an edge detection circuit 25 that includes a first filter module 12, a second filter module 13, and the soft latch module 14. The first filter module 12 includes a capacitor 46, a controlled impedance 34, and an inverter 32. The controlled impedance 34 is shown to include a current source 40, p-channel transistor 36 and p-channel transistor 38. The inverter 32 is shown to include a p-channel transistor 42 and an n-channel transistor 44. The soft latch module 14 is shown to include a NAND gate 50, an inverter 52, a resistor 54, and a drive transistor 30. The drive transistor 30 is shown to include an n-channel transistor 48. The filter module 13 may include similar components to that of filter module 12 and is coupled to receive a second input logic signal 17.

The filter module 12 is operably coupled to receive the input logic signal 16 via capacitor 46. In this illustration, the filter module 12 is operably coupled to detect a falling edge of the input logic signal 16. However, as one of average skill in the art will appreciate, the filter module 12 could easily be modified to sense a rising edge of the input logic signal by using n-channel transistors in the controlled impedance 34. In the illustration shown, when a falling edge of the input logic signal 16 occurs, the drain of transistor 38 is pulled low through capacitor 46, which turns on transistor 38. Current source 40 and transistor 36 control the current flow through transistor 38 such that its impedance is of a calculated value. As is known, using the physics of semiconductor design, one of average skill in the art can readily determine the impedance of transistor 38. Note that the impedance of transistor 38 is selected with respect to the capacitance value of capacitor 46 such that the resistor-capacitor (RC) circuit formed via transistor 38 and capacitor 46 is tuned to the fall time of the edge of the input logic signal 16. This is done to prevent false triggering and to allow the input logic signal 16 to be used as a multi-input port. For example, input logic signal 16 may be coupled to a pressure sensitive switch that produces a variety of signals depending the pressure applied to the switch and the duration of the pressure.

As the source of transistor 38 is temporarily pulled low via capacitor 46, the gate of transistor 42 is also pulled low, thus turning on transistor 42. As transistor 42 turns on, transistor 44 also turns on. The drain of transistor 44 produces the pulse signal 18. Note that the time constant of the RC circuit formed by capacitor 46 and transistor 38 primarily dictates how long transistor 42 will be on, which dictates the duration of the pulse signal 18.

The soft latch logic 14 receives the pulse signal 18 via the drive transistor 30. Assume that the input signal 56 is high and, prior to the current pulse signal 18, the output of NAND gate 50 is low. Thus the input of inverter 52 is low and the output of inverter 52 is high. As the drive transistor 30 pulls the node coupling resistor 54 to NAND gate 50 low, the output of NAND gate 50 goes high. With the output of NAND gate 50 high, the output of inverter 52 goes low. When the pulse signal 18 dies out, transistor 48 turns off, but the node coupling resistor 54 to NAND gate 50 remains low latching the output of NAND gate 50 to a logic "1". In this configuration, resistor 54 provides the soft latch between the NAND gate 50 and the inverter 52. Note that resistor 54 may be intrinsic resistance built into the inverter 52. For instance, inverter 52 may be built from weak transistors with small width/height ratio.

When the latched logic value 20 (i.e., the output of NAND gate 50) is a logic "1", it will transition low when the input signal 56 is set to a logic "1" and the node coupling resistor 54 to the NAND gate 50 is temporarily pulled high The temporary pulling of the node high may be done utilizing a second signal coupled to a capacitor that is in turn coupled to a controlled impedance, similar to controlled impedance 34. The node coupling the capacitor to the controlled impedance may be directly coupled to the node coupling resistor 54 to NAND gate 50 or indirectly coupled through a p-channel drive transistor, analogous to drive transistor 30. With either coupling, when the second signal transitions low, the controlled impedance will temporarily pull up on the node coupling resistor 54 to NAND gate 50. If this occurs when the input signal 56 is high, the latched logic value 20 will transition to a logic "0" state.

FIG. 3 illustrates an edge detection circuit 60 that includes an input gate device 62, a processing module 66, memory 68, a filter module 12, and a soft latch module 14. The edge detection circuit 60 may also include a second input gate device 64, which may sense one or more user operated switches 72 and 74. The processing module 66 may be a single processing device or a plurality of processing devices. Such a processing device may be a microprocessor, microcontroller, microcomputer, digital signal processor, central processing unit, state machine, logic circuitry, and/or any device that manipulates signals (analog or digital) based on operational instructions. The memory 68 may be a single memory device or a plurality of memory devices. Such a memory device may be a read only memory, random access memory, non-volatile memory, flash memory, system memory, magnetic tape memory, disk memory, and/or any device that stores digital information. Note that when the processing module implements one or more of its functions via a state machine or logic circuitry, the memory storing the corresponding operational instructions is embedded in the circuitry comprising the state machine or logic circuitry.

In operation, the input gate device 62 senses the state of the user operated switch 70. The user operated switch 70 may be any type of switch useable for hand-held MP3 players/recorders, CD players, digital cameras, etc. Such a switch may be, but is not limited to, a membrane switch, a toggle switch, a one-shot switch, a pressure sensitive switch, or a combination of switches. The input gating device 62 may sense the state of the user operated switch 70 via a general purpose input/output (GPIO) protocol and provides the sensed stated of switch 70 to the processing module 66 as an input logic signal 16. The processing module 66 interprets the input logic signal 16 to produce a processed logic signal 76. Depending on the type of switch 70, the processed logic signal 76 may represent one of many different commands. For example, if switch 70 is a toggle switch used to enable/disable the corresponding device, the processed logic signal 76 would be reflective of enabling/ disabling the device. If, as an alternate example, switch 70 is a pressure sensitive switch, the processed logic signal 76 may be representative of volume control, enabling/disabling the device, standby mode, reset mode, set mode, etc. The filter module 12 receives the processed logic signal 76 and processes it as previously described with reference to FIGS. 1 and 2. The soft latch module 14 receives the pulse signal 18 and processes it as previously described with reference to FIGS. 1 and 2 to produce the logic latch value 20.

If the edge detection circuit 60 includes a second input gate device 64, multiple input logic signals may be received by the processing module 66. Based on the operational instructions, the processing module would process each of the input logic signals to produce the processed logic signal 76. For example, one input logic signal may be representative of enabling/disabling of the device, another input logic signal may be representative of set/reset of the device, another input logic signal may be representative of mute/ unmute of an output analog signal, another input logic signal may be record/play, etc. As one of average skill in the art will appreciate, multiple filter modules and associated soft latch modules may be coupled to the processing module 66 to provide the corresponding logic latch value when multiple input logic signals are being processed.

The preceding discussion presented multiple embodiments of an edge detection circuit that may be used in a highly integrated system, such as an MP3 player. By incorporating such an edge detection circuit, a highly integrated system may be set/reset, enabled/disabled, etc. without lock-ups due to fixed logic states representative of the corresponding operation. As one of average skill in the art will appreciate, other embodiments of the present invention may be derived from the teachings presented herein without deviating from the scope of the claims or the spirit of the invention.

What is claimed is:

1. An edge sensitive detection circuit comprising:
a filter module operably coupled to receive an input logic signal, wherein the filter module produces, independent of a clock, a pulse signal in response to an edge of the input logic signal, wherein the filter module includes:
a capacitor operably coupled to receive the input logic signal; and
a gating circuit operably coupled to the capacitor, wherein the gating circuit generates the pulse signal, wherein the capacitor and an impedance of at least one element of the gating circuit are tuned based on at least one of rise time or fall time of the input logic signal; and
a soft latch module operably coupled to receive the pulse signal, wherein the soft latch module latches a logic value in accordance with the pulse signal.

2. The edge sensitive detection circuit of claim 1, wherein the soft latch module comprises:
a first inverting logic element; and
a second inverting logic element having an output impedance, wherein an input of the first inverting logic element is coupled to the output impedance, wherein an input of the second inverting logic element is coupled to an output of the first inverting logic element, and wherein the pulse signal is received at the coupling of the input of the first inverting logic element and the output impedance.

3. The edge sensitive detection circuit of claim 2, wherein the second inverting logic element comprises an inverter and wherein the first inverting logic element comprises at least one of an inverter and a NAND gate.

4. The edge sensitive detection circuit of claim 1, wherein the gating circuit comprises:
an inverter, wherein an output of the inverter is operably coupled to a drive transistor of the soft latch module; and
a controlled impedance coupled to the capacitor and to a ground voltage, wherein an input of the inverter is operably coupled to the coupling of the controlled impedance to the capacitor.

5. The edge sensitive detection circuit of claim 1, wherein the input logic signal is at least one of: a reset signal, a power down signal, a power up signal, a standby signal, and a set signal.

6. The edge sensitive detection circuit of claim 1 further comprises a second filter module operably coupled to receive a second input logic signal, wherein the second filter module produces a second pulse signal in response to an edge of the second input logic signal, and wherein the soft latch module latches the logic value in accordance with the second pulse signal.

7. The edge sensitive detection circuit of claim 6, wherein the second filter module comprises:
a second capacitor operably coupled to receive the second input logic signal; and
a second gating circuit operably coupled to the second capacitor, wherein the gating circuit generates the second pulse signal, wherein the second capacitor and an impedance of at least one element of the second gating circuit are tuned based on at least one of rise time or fall time of the second input logic signal.

8. A edge sensitive detection circuit comprises:
an input gating device;
a processing module operably coupled to the input gating device, wherein the processing module utilizing operational instructions to process an input logic signal from the input gating device to produce a processed logic signal;
a filter module operably coupled to receive the processed logic signal, wherein the filter module produces, independent of a clock, a pulse signal in response to an edge of the processed logic signal; and
a soft latch module operably coupled to receive the pulse signal, wherein the soft latch module latches a logic value in accordance with the pulse signal.

9. The edge sensitive detection circuit of claim 8 further comprises:
a second gating device that provides a second input logic signal to the processing module, wherein the processing module produces a second processed logic signal based on the second input logic signal;
a second filter module operably coupled to receive the second processed logic signal, wherein the second filter module produces a second pulse signal in response to an edge of the second processed logic signal; and
a second soft latch module operably coupled to receive the second pulse signal, wherein the second soft latch module latches a logic value in accordance with the second pulse signal.

10. The edge sensitive detection circuit of claim 8, wherein the input gating device provides one of a plurality of input logic signals as the input logic signal.

11. The edge sensitive detection circuit of claim 8, wherein the soft latch module comprises:
a first inverting logic element; and
a second inverting logic element having an output impedance, wherein an input of the first inverting logic element is coupled to the output impedance, wherein an input of the second inverting logic element is coupled to an output of the first inverting logic element, and wherein the pulse signal is received at the coupling of the input of the first inverting logic element and the output impedance.

12. The edge sensitive detection circuit of claim 8, wherein the filter module comprises:
a capacitor operably coupled to receive the input logic signal; and
a gating circuit operably coupled to the capacitor, wherein the gating circuit generates the pulse signal, wherein the capacitor and an impedance of at least one element of the gating circuit are tuned based on at least one of rise time or fall time of the input logic signal.

13. The edge sensitive detection circuit of claim 12, wherein the gating circuit comprises
an inverter, wherein an output of the inverter is operably coupled to a drive transistor of the soft latch module; and
a controlled impedance coupled to the capacitor and to a ground voltage, wherein an input of the inverter is operably coupled to the coupling of the controlled impedance to the capacitor.

14. The edge sensitive detection circuit of claim 8, wherein the input logic signal comprises at least one of: a reset signal, a set signal, a power down signal, a power on signal, and a standby signal.

15. The edge sensitive detection circuit of claim 8 further comprises a second filter module operably coupled to receive a second input logic signal, wherein the second filter module produces a second pulse signal in response to an edge of the second input logic signal, and wherein the soft latch module latches the logic value in accordance with the second pulse signal.

16. An edge sensitive detection circuit comprising:
- a capacitor operably coupled to receive an input logic signal;
- a controlled impedance coupled to the capacitor, wherein the capacitor and an impedance of at least one element of a gating circuit are tuned based on at least one of rise time or fall time of the input logic signal;
- an inverter, wherein an input of the inverter is operably coupled to the coupling of the controlled impedance to the capacitor;
- a drive transistor operably coupled to produce a pulse signal, independent of a clock signal, wherein an output of the inverter is operably coupled to the drive transistor; and
- a soft latch module operably coupled to receive the pulse signal, wherein the soft latch module latches a logic value in accordance with the pulse signal.

17. The edge sensitive detection circuit of claim 16, wherein the soft latch module comprises:
- a first inverting logic element; and
- a second inverting logic element having an output impedance, wherein an input of the first inverting logic element is coupled to the output impedance, wherein an input of the second inverting logic element is coupled to an output of the first inverting logic element, and wherein the pulse signal is received at the coupling of the input of the first inverting logic element and the output impedance.

* * * * *